(12) United States Patent
Böhmer et al.

(10) Patent No.: US 10,374,521 B2
(45) Date of Patent: Aug. 6, 2019

(54) BUSBAR ARRANGEMENT

(71) Applicant: SIEMENS AKTIENGESELLSCHAFT, München (DE)

(72) Inventors: Jürgen Böhmer, Stein (DE); Rüdiger Kleffel, Erlangen (DE); Eberhard Ulrich Krafft, Nürnberg (DE); Andreas Nagel, Nürnberg (DE); Jan Weigel, Grossenbuch (DE)

(73) Assignee: SIEMENS AKTIENGESELLSCHAFT, München (DE)

( * ) Notice: Subject to any disclaimer, the term of this patent is extended or adjusted under 35 U.S.C. 154(b) by 0 days.

(21) Appl. No.: 16/064,928

(22) PCT Filed: Nov. 25, 2016

(86) PCT No.: PCT/EP2016/078864
§ 371 (c)(1),
(2) Date: Jun. 21, 2018

(87) PCT Pub. No.: WO2017/108333
PCT Pub. Date: Jun. 29, 2017

(65) Prior Publication Data
US 2019/0036461 A1 Jan. 31, 2019

(30) Foreign Application Priority Data
Dec. 22, 2015 (EP) .................................... 15201849

(51) Int. Cl.
*H02M 7/00* (2006.01)
*H05K 7/14* (2006.01)
(Continued)

(52) U.S. Cl.
CPC ........ *H02M 7/003* (2013.01); *H01L 23/5223* (2013.01); *H01L 25/16* (2013.01); *H05K 7/1432* (2013.01)

(58) Field of Classification Search
None
See application file for complete search history.

(56) References Cited

U.S. PATENT DOCUMENTS 4,262,163 A * 4/1981 Durrell .................. H02G 5/005
174/33
4,897,598 A * 1/1990 Doemens ........... G01R 1/07371
324/500
(Continued)

FOREIGN PATENT DOCUMENTS

DE 10 2004 060 583 A1 7/2006
EP 2 493 043 A2 8/2012
(Continued)

OTHER PUBLICATIONS

Siemens. "DE102004060583A1" English translation. 2006. Espacenet. (Year: 2006).*
(Continued)

*Primary Examiner* — Dimary S Lopez Cruz
*Assistant Examiner* — Muhammad Azam
(74) *Attorney, Agent, or Firm* — Henry M. Feiereisen LLC

(57) ABSTRACT

A busbar arrangement for making electrical contact with a semiconductor module includes at least two busbars overlapping in an overlap region and electrically insulated from one another. Each busbar includes a web having a connection element, with the webs of the busbars being arranged without an overlap. The webs are oriented such as to define a first axis which runs through the connection element of an associated one of the webs and a point of a transition of the web to the overlap region of the busbar arrangement, and
(Continued)

which intersects a second axis which is formed by a connection between two connection elements of the webs at an angle between 0° and 45°. The busbar arrangement includes an insulating region to reduce or prevent a current in the web in a direction perpendicular to the second axis. The overlap region and the webs are each located in one plane.

17 Claims, 7 Drawing Sheets

(51) Int. Cl.
*H01L 25/16* (2006.01)
*H01L 23/522* (2006.01)

(56) References Cited

U.S. PATENT DOCUMENTS

| | | | | |
|---|---|---|---|---|
| 5,008,483 | A * | 4/1991 | Wagener | H01R 25/14 |
| | | | | 174/68.2 |
| 5,008,484 | A * | 4/1991 | Wagener | H01R 25/14 |
| | | | | 174/68.2 |
| 6,696,906 | B1 * | 2/2004 | deBlanc | H01P 3/085 |
| | | | | 174/117 AS |
| 7,470,870 | B2 * | 12/2008 | Schmidt | H01H 71/08 |
| | | | | 200/400 |
| 8,432,694 | B2 * | 4/2013 | Hentschel | H01L 23/473 |
| | | | | 165/80.4 |
| 8,512,057 | B2 * | 8/2013 | Haar | H02G 5/007 |
| | | | | 439/212 |
| 8,520,386 | B2 * | 8/2013 | Bott | H01L 23/473 |
| | | | | 165/80.4 |
| 9,053,869 | B2 | 6/2015 | Kleffel | |
| 9,906,160 | B2 | 2/2018 | Nagel et al. | |
| 2007/0228520 | A1 * | 10/2007 | Winn | H01L 23/5223 |
| | | | | 257/580 |
| 2008/0099906 | A1 * | 5/2008 | Yamasaki | H01L 23/49551 |
| | | | | 257/691 |
| 2009/0161301 | A1 * | 6/2009 | Woody | H05K 7/209 |
| | | | | 361/678 |
| 2010/0049467 | A1 * | 2/2010 | De Crecy | G01B 21/085 |
| | | | | 702/136 |
| 2010/0089641 | A1 | 4/2010 | Esmaili et al. | |
| 2011/0140532 | A1 * | 6/2011 | Cherukupalli | H01L 31/02021 |
| | | | | 307/77 |
| 2011/0221268 | A1 * | 9/2011 | Kanazawa | H05K 1/0263 |
| | | | | 307/10.1 |
| 2012/0217032 | A1 | 8/2012 | Beaupre et al. | |
| 2013/0126204 | A1 * | 5/2013 | Nohara | H01H 85/044 |
| | | | | 174/50 |
| 2013/0187453 | A1 | 7/2013 | Flett et al. | |
| 2013/0271941 | A1 | 10/2013 | Guan et al. | |
| 2015/0155692 | A1 * | 6/2015 | Hwang | H02G 5/025 |
| | | | | 174/70 B |
| 2015/0340157 | A1 * | 11/2015 | Wen | H02M 7/003 |
| | | | | 361/328 |
| 2017/0027074 | A1 * | 1/2017 | Ichikawa | H01L 23/49844 |
| 2017/0358897 | A1 * | 12/2017 | Young | H02M 3/155 |
| 2019/0036461 | A1 * | 1/2019 | Bohmer | H01L 23/5223 |

FOREIGN PATENT DOCUMENTS

| | | |
|---|---|---|
| RU | 2094884 C1 | 10/1997 |
| RU | 76511 U1 | 9/2008 |

OTHER PUBLICATIONS

International Search Report issued by the European Patent Office in International Application PCT/EP2016/078864 filed on Nov. 25, 2016.

* cited by examiner

BUSBAR ARRANGEMENT

CROSS-REFERENCES TO RELATED APPLICATIONS

This application is the U.S. National Stage of International Application No. PCT/EP2016/078864, filed Nov. 25, 2016, which designated the United States and has been published as International Publication No. WO 2017/108333 and which claims the priority of European Patent Application, Serial No. 15201849.5, filed Dec. 22, 2015, pursuant to 35 U.S.C. 119(a)-(d).

BACKGROUND OF THE INVENTION

The invention relates to a busbar arrangement for making electrical contact with at least one semiconductor module, wherein the busbar arrangement has at least two busbars, wherein the busbars are arranged in a mutually overlapping manner at least in an overlap region of the busbar arrangement, wherein the busbars are electrically insulated from one another, wherein the busbars each have at least one web with a connection element, wherein the webs of the busbars are arranged without an overlap. The invention further relates to a converter module with such a busbar arrangement, a semiconductor module and at least one capacitor. The invention further relates to the use of a busbar arrangement of this kind to connect at least one semiconductor module to at least one capacitor.

By virtue of their ability to be able to switch large currents quickly and often, semiconductors need a low-inductance connection to a capacitor. This capacitor is also referred to as a DC link capacitor. Busbars are mostly used to establish the low-inductance connection. In such cases converters for high powers are typically constructed with semiconductor modules, also just referred to as modules, arranged next to one another and switched in parallel. In a typical connection geometry the direct current connections, also referred to as DC+/DC− connections, lie next to one another on one side of the module. To make them suitable for highly-dynamically switched semiconductor chips, a small inductance in the module, and also in the external commutation circuit, is essential. These modules offer the option of a modular converter structure in order to adapt to the power requirements by parallel switching or to adapt to the desired function (different converter phases) by independent load connection.

In such cases a high-grade current symmetry of the parallel-switched semiconductor module is desirable, since the module bearing the highest load defines the power of the parallel circuit. In this case the power of a module should, if possible, be independent of the neighboring independently-driven module. The pairs of direct current connections lying next to one another, i.e. the DC+ and DC− connection, at least make contact with a common DC link circuit busbar system.

A busbar and a busbar pair for a planar module are known from DE 10 2004 060 583 A1. In this invention the busbar has a number of connection tags, each of which has a connection region provided with a drilled hole, wherein each connection tag is formed by means of a slot from an edge area of the busbar and by means of two bent edges such that its connection regions are arranged spaced apart from one another next to one another in a plane parallel to the busbar. Thus the low-inductance planar busbar system of the two busbars is continued into the connection region of the planar module.

A busbar assembly for an inverter module with a power module, a capacitor module with at least one capacitor and a battery, which connects all these components to one another by a busbar, is known from US 2010/0089641 A1. The busbar has a base portion that is coupled electrically to the battery, and a branch busbar portion that extends from the base busbar to the power module and connects this electrically to the capacitor module at points between the base node and the power module.

SUMMARY OF THE INVENTION

The underlying object of the invention is to specify a connecting element for connection to a semiconductor module, which reduces an interaction between the connections of the semiconductor module or the semiconductor modules and that has a small thickness.

The object is achieved by a busbar arrangement for making electrical contact with at least one semiconductor module, wherein the busbar arrangement has at least two busbars, wherein the busbars are arranged in a mutually overlapping manner at least in an overlap region of the busbar arrangement, wherein the busbars are electrically insulated from one another, wherein the busbars each have at least one web with a connection element, wherein the webs of the busbars are arranged without an overlap, wherein the webs are oriented such that a first axis can be formed, which runs through the connection element of the respective web to the overlap region of the busbar arrangement, and which intersects a second axis, which is formed by a connection of two connection elements of the webs, at an angle of between 0° and 45°, wherein the busbar arrangement has an insulating region, which is arranged so as to reduce or to prevent a current in the web in a direction perpendicular to the second axis. The object is further achieved by an inverter module with such a busbar arrangement, by at least one semiconductor module and by at least one capacitor, wherein the semiconductor module has two direct current connections, wherein the direct current connections are each electrically connected to one connection element of the busbar arrangement, wherein the capacitor has two electrodes, wherein the busbars of the busbar arrangement are each connected electrically to an electrode of the capacitor. The object is further achieved by the use of a busbar arrangement of this kind for connecting at least one semiconductor module to at least one capacitor, especially in a converter.

Advantageous embodiments of the invention are specified in the dependent claims.

The idea underlying the invention is that the interaction between the direct current connections of a semiconductor module or of a number of semiconductor modules can be reduced by the magnetic coupling of the magnetic fields that are generated by the currents at the direct current connections being reduced. One way in which these can be influenced is by the embodiment of the connection elements of the busbar arrangement. Various connection designs are conceivable for this, which are subject in each case to restrictions to the insulation requirements between the direct current potentials. Common to all in each case however is the function of making contact between a DC link circuit and a semiconductor module or at least two semiconductor modules, wherein differences are produced in the surrounding area close to the modules, especially the module connections.

In such cases the current paths in the busbar system always span loops, which generate magnetic fields and are coupled to external fields. The current density distribution in the busbar system is essentially oriented to the ohmic and the inductive impedances and to the mandatory geometrical conditions. The smaller the frequency, the more the current density distributions are set in accordance with the ohmic losses. The higher the frequency is, the more the forward current looks for the proximity of the return current in order to minimize the energy content of the magnetic field. Forward current refers to the current in one of the two busbars. The return current is a current opposite to the forward current in the other busbar in each case. So that forward current and return current can compensate for one another as well as possible the busbars are arranged in parallel to one another in the overlap region. The distance will essentially be defined by the potential difference of the busbars. A flashover between the busbars must be prevented. In order to keep the distance as small as possible and thereby to prevent the formation of magnetic fields arising, it has proved advantageous to arrange an insulator between the busbars. This allows the distance to be kept small.

This means that the overlap region does not represent any significant source for a magnetic field, since forward current and return current compensate for each other in this region and the magnetic fields associated therewith likewise compensate for one another and do not create any coupling effect.

The overlap region is the area in which the two busbars overlap. In other words, depending on the angle of view, these busbars lie next to one another or above one another in this area. Expressed differently one busbar lies behind the other busbar in the overlap region when viewed from an axis onto the busbar arrangement, which is perpendicular to the busbar arrangement. In the overlap region the busbars can be arranged in parallel, but this is not absolutely necessary. It is likewise possible to arrange the busbars in parallel to one another in a first part of the overlap region and to arrange the busbars not in parallel to one another in another second part of the overlap region, for example in the vicinity of the transition between web and overlap region. Thus, in particular with a non-parallel arrangement, it can still be assumed that there is an overlapping arrangement, if with a non-parallel arrangement of the busbars, these intersect at an angle of up to 90°.

In the region of the connections the busbars can be embodied mostly non-overlapping. This area is thus free from overlaps. The overlap-free region is formed by means of a web. In such cases the webs each have at least one connection element. The connection element, in a simple embodiment, can involve a hole, which can establish an electrical contact to the semiconductor module by means of a screw. The webs in such cases are designed so that a current flowing through them generates a magnetic field, which does not penetrate, or only penetrates to a small extent, another web or a connection that is electrically insulated from the web. The webs in such cases are oriented such that they run in parallel to an axis, which is formed by the connections of a semiconductor or a number of semiconductors. The orientation of the web is to be understood as the orientation of the connection of the connection element to the transition to the overlap region. The current essentially also flows in this direction during operation. Even a deviation of up to 45° from a parallel course, i.e. a range of angles of 0° to 45°, still causes a sufficient reduction in coupling magnetic fields. With a current flow that occurs in parallel to the second axis, in the ideal case the coupling is completely removed. In the range of angles specified above however the coupling is already so small that in particular operation with high frequencies, in which the inductances have a particularly strong effect, is already possible in an advantageous manner.

Since the current fans out from the connection element to the transition in the web, there is also a small proportion of the current in a direction perpendicular to the orientation of the web, which is however smaller or far smaller than the proportion in the direction in parallel to the orientation of the web. This enables a magnetic coupling of the different connections of one or more semiconductor modules to be greatly reduced or to be avoided completely.

The inventive arrangement enables undesired magnetic couplings between the connections, in particular the direct current connections, of neighboring modules or neighboring circuits, for example different half bridges, of a module to be avoided, which lead to inductances with different effects in the different webs. In particular with highly-dynamic switching processes, said processes would otherwise on the one hand, with parallel switching, have a negative effect on the current symmetry. On the other hand they lead to undesired couplings in the switching behavior of neighboring, independent modules, of which the commutation currents can basically be different, even opposingly of the same size. This is avoided by the inventive busbar arrangement.

It has been shown that the lower the inductance of the module structure is and the faster the current change in the connections is, the more advantageous is the effect of the busbar arrangement in accordance with the invention on the decoupling of the individual connections of the semiconductor module or of the semiconductor modules. Moreover a parasitic coupling-in of magnetic fields into control circuits of a neighboring electronic circuit can be greatly reduced, which would otherwise lead to a dependent switching behavior of different modules.

The busbar arrangement is very largely constructed in accordance with a strip line, which conveys forward and return current in planar arrangement directly adjacent to one another. Where this is not possible for insulation reasons the geometry will be designed such that the current flow on the busbars does not generate any magnetic field components, which couple into neighboring connections. The surface spanned, in which a voltage can be induced by parasitic magnetic fields, is reduced to a minimum. To this end a minimum surface between the busbars is provided in the planes parallel to the distance. Because of a suitable geometry of the webs a magnetic influencing of neighboring modules by currents, which do not flow in the strip line is minimized or removed.

The busbar system produces the benefits of a minimal emission of parasitic magnetic fields. This is accompanied by a minimal coupling-in of parasitic magnetic fields in undesired regions. Through this, both in the power circuit and also across the control circuits, the mutual influencing of semiconductor modules arranged next to one another or of switching circuits of a semiconductor module arranged next to one another is minimized.

For a converter the benefit produced is that a number of semiconductor modules, for different phases for example, can be arranged in close physical proximity. This enables the converters to be manufactured especially small, light and compact.

It has proved advantageous to arrange an insulating region in the busbar arrangement. The insulating regions are non-conducting regions in the busbar arrangement. Expressed differently these are regions in the busbar arrangement in which no busbar is present or to which the busbars do not extend. These can be realized in a simple manner for example by removing the material of the busbar. Thus the busbars can have recesses, cutouts or holes (round, rectangular or as a slot) for example, which lead to the course of the current in the busbar, in particular in the web, being influenced. Thus for example, recesses, holes or cutouts, for example rectangular, can be present in a copper busbar, which prevent or at least reduce a flow of current in this area and/or in a specific direction. Also a physically separate arrangement of parts of the busbar, in which air is present in the gap between the parts of the busbar, can be viewed as an insulating region. With the aid of the insulating region it is possible to convey the current in the web such that it runs in parallel to the second axis. The second axis involves an axis that is formed by the connection of two connection elements of the webs. Thus this axis corresponds to the axis that is formed by the connection of a semiconductor module or by the connections of different semiconductor modules. In a simple and low-cost manner this enables a flow of current in one direction to be prevented, which generates a magnetic field that has a coupling effect on the other connections. Through the orientation of the webs a flow of current is possible in the web such that a coupling magnetic field is prevented. In addition, through the introduction of an insulating region, a flow of current in the web is prevented that can lead to a coupling magnetic field. This is a magnetic field that intersects with other webs of the busbar arrangement.

In this case, the insulating region of the busbar arrangement can be arranged in the vicinity of the web or in the vicinity of the overlap region. Moreover it is possible to arrange a number of insulating regions in the busbar arrangement. Also the insulating region can extend to areas that lie in the vicinity of web and overlap region.

In an advantageous embodiment of the invention the webs are oriented such that a further first axis can be formed, which runs through the connection element of the respective web and a point of the transition between the respective web and the overlap region of the busbar arrangement, and which runs parallel or essentially parallel to the second axis. Essentially parallel in this context means that the different distance from the direct current connection of the semiconductor module is ignored. This distance is produced because of the overlapping arrangement, since one busbar is somewhat further away from the direct current connections than the other. Depending on the size of the web, an angle of up to 10° or of up to 20°, which arises from the distance of the busbars from one another, between further first axis and second axis can still be seen as essentially parallel.

Through this embodiment, one of the cases that is also included is that in which the webs are oriented in a direction that corresponds to the connection of the connections of the semiconductor module and/or of the semiconductor modules. Moreover this embodiment includes the case in which the overlap region and the webs are each located in one plane. This allows the busbar arrangement and the corresponding busbars to be manufactured in an especially simple manner. The orientation of the webs in a direction parallel to an axis that is formed by the connections of the semiconductor module does not cause any or only causes a slight interaction of a current of a connection of the semiconductor module and another connection of the semiconductor module or of another semiconductor module. The axis that is formed by the connections of the semiconductor module generally corresponds to the axis that is formed by a connection of two connection elements of the webs.

Since the magnetic field lines form in an approximately circular shape around the webs when current flows though the webs, no magnetic field that is formed by this current is present at the remaining connections of the semiconductor module and/or at the remaining connections of the remaining semiconductor modules. If at all, stray fields can merely be produced as a result of irregularities, which are only of small size however.

The direction of a web is to be understood as the axis that is produced from the connection point of the web and the transition from web to overlap region. The direction of the web essentially corresponds to the direction of the current that flows through this web.

In a further advantageous embodiment of the invention the insulating region is arranged so as to reduce or to prevent the formation of a current in the transition between web and overlap region in a direction perpendicular to the second axis. It has proved advantageous to manufacture the webs from a conducting material such as copper for example, to provide an insulating region in the area of the connection elements and thus to be able to specify a direction for the current in the web from the connection element to the overlap region. In this case the insulating region is advantageously arranged in a region that ties between web and overlap region and prevents the formation of a current that runs perpendicular to an axis that is formed by the connections of the semiconductor module or of the semiconductor modules. Moreover it has proved useful, through the insulating region, to prevent currents that intersect an axis that is formed by the connections of the semiconductor module or of the semiconductor modules at an angle of greater than 45°. It has proved especially advantageous to prevent currents that do not run parallel to an axis that is formed by the connections of the semiconductor module or of the semiconductor modules. The insulating regions allow busbars, especially busbars with a large surface area, with a surface area of more than 100 cm$^2$, to be manufactured in a simple manner from a conductive material such as copper for example.

Moreover it has proved useful in this embodiment of the invention for the webs to have at least two transitions to an overlap region. These transitions, as well as conducting the current, can also serve to fix, i.e. to hold, the busbars. It has been shown that, even with two transitions, the weight of the busbars can be borne by the transitions between web and overlap region. Specific holders, which could possibly also lead to the holders being mechanically overstressed, can be dispensed with. The overstressing means that the holders react sensitively to temperature fluctuations, which arise during operation at the devices and systems at which the busbars are located. Holding the busbars via the webs means that additional holders can be dispensed with and the arrangement is not overstressed during thermal expansion, so that the lifetime of this arrangement can be greatly improved hereby in some cases.

In a further advantageous embodiment of the invention the insulating region is arranged such that it adjoins an overlap region. This involves a form of embodiment of how a current in the web perpendicular to the second axis can be prevented. To this end recesses, i.e. insulating regions, are arranged in the vicinity of the overlap region. It has proved to be especially advantageous for the insulating regions to adjoin the overlap region on at least two or on at least three sides or in the form of a circle segment, especially of a semicircle. This enables an insulating region to be created in an especially simple manner such that a current in the web perpendicular to the second axis is reliably avoided or at least greatly reduced.

In a further advantageous embodiment of the invention the insulating region is arranged in some sections on a boundary between web and overlap region. The conductive effect is thus removed at a boundary between web and overlap region, so that no current can flow in this direction. This insulation can be used in an advantageous way to force a current parallel to the second axis in the web, in that a component perpendicular to the second axis is avoided by the insulating region. The boundary between web and overlap region thus no longer represents a transition between web and overlap region, since a flow of current from web to overlap region or from overlap region to web is no longer possible. The exemplary embodiments shown and described in the figures in particular show an insulating region at the boundary between web and overlap region.

The difference between boundary and transition lies in the fact that with the boundary there does not have to be a conductive transition between web and overlap region at this point, but these only lie close to one another. If necessary, as in this exemplary embodiment, the insulating region can be arranged at least in some sections at the boundary between web and overlap region.

In a further advantageous embodiment of the invention at least two of the webs are embodied symmetrically to one another. The symmetrical structure produces symmetrical circumstances in relation to the magnetic fields. In particular when the coupling to other connections is not completely prevented, it can be insured by the symmetrical structure that at least the coupling is the same or at least almost the same overall. In this way the connections of the semiconductor module or of the semiconductor modules have at least an almost equivalent behavior.

A symmetrical embodiment of two webs means in particular that the two webs are designed symmetrical to a plane, mirror-symmetrical, axis-symmetrical or point-symmetrical in relation to one another.

The symmetrical embodiment of the busbars can be achieved in a simple manner by two busbars being embodied identically, but by one busbar being arranged rotated by 180°. The case of symmetrical busbars also includes the embodiment of the busbars being embodied identically, but being displaced in relation to each other such that the connection elements of the respective busbars are located at different points. This has the advantage of being able to use the same busbars to construct the busbar arrangement. By using the same parts this facilitates the logistics and inventory for manufacturing a busbar arrangement of this kind.

In a further advantageous embodiment of the invention an insulating layer is arranged in the overlap region of the busbar arrangement between the busbars and the busbars adjoin the insulating layer in each case at least in some sections. It has proved advantageous to arrange an insulating layer between the busbars. In an advantageous manner this has a good electrically insulating property. The result achieved by this is that, despite a high potential difference, the busbars can be arranged in close physical proximity without damage occurring through flashovers. The physical proximity of the busbars has the effect, in the overlap region of the busbar arrangement, of the magnetic fields that arise from the currents flowing in the busbars largely compensating for each other. Moreover it is insured by the insulating layer that a minimum distance is maintained between the busbars by the thickness of the insulating layer material. Moreover the structure in which the insulating layer is arranged between the busbars gives this structure a higher mechanical stability. The insulating layer is also referred to as an insulator.

In a further advantageous embodiment of the invention the busbars each have at least two webs, each with at least one connection element. This embodiment is suitable for connecting a number of semiconductor modules to the busbar arrangement. As an alternative or in addition a semiconductor module can also be constructed in a modular fashion such that it has a number of similar direct current connections, i.e. more than one DC+ and more than one DC− connection. This enables the performance of a semiconductor module to be enhanced by a number of submodules with their own connections being present in the structure of the semiconductor module, wherein the connections of the submodules also represent the connections of the semiconductor module.

The busbars with a number of webs are also especially suitable for the construction of a bridge circuit in which a number of phases on the alternating current side are connected via semiconductor modules to the same DC link circuit, especially to the same DC link capacitor or to the same DC link capacitors, on the direct current side.

In both cases it has proved advantageous for pairs of connection elements that are intended for connection to direct current connections of the same semiconductor module, to form an axis in each case and for these axes of the different semiconductor modules to run parallel to one another. It has proved especially advantageous for all connection elements of the busbar arrangement to lie on a common axis. This enables both the busbar arrangement and also the semiconductor modules to be arranged in a simple and space-saving manner. Moreover with this arrangement the coupling of the individual connections, in particular the coupling between connections of different semiconductor modules, is very slight or no longer evident.

In a further advantageous embodiment of the invention the converter module has at least two semiconductor modules, wherein the semiconductor modules are arranged in a parallel circuit as regards their direct current connections. The disruptive effect of the coupling-in of magnetic fields is great especially when different phases of a converter module are involved. Different phases of a converter module are constructed by separate semiconductor modules. In order largely to decouple these different semiconductor modules from one another, the use of a busbar arrangement has proved useful, which in each case has busbars with a number of webs and thus also busbars with a number of connection elements. With these there can be an especially useful decoupling of the semiconductor modules, if the semiconductor modules in the converter module are arranged such that the connections, especially the direct current connections, of the individual semiconductor modules each form an axis and if these axes at least run in parallel to one another. It has proved especially useful for the direct current connections of the individual semiconductor modules to be flush with one another, i.e. for these to lie on one axis.

In a further advantageous embodiment of the invention the semiconductor module has at least two series circuits of semiconductor switches and has at least four direct current connections. The semiconductor module can be of a modular design such that it not only has one half bridge but has a number, i.e. more than one, half bridge. In a half bridge at least two semiconductor switches are arranged in a series circuit. To increase the performance it has also proved advantageous to arrange a number of half bridges in a module. This enables the performance of a phase to be enhanced or enables a number of phases to be integrated into a semiconductor module. With more than two bridge circuits both benefits can also be obtained at the same time.

In this case it has proved especially advantageous for the direct current connections of different half bridges of the modular semiconductor module to be insulated from one another within the module and to be connected electrically to one another by the busbar arrangement. In this case each bridge circuit has at least two direct current connections. These are at least one DC+ connection and at least one DC− connection. Thus the modular semiconductor module has at least four direct current connections.

The advantage of this modular semiconductor module lies in being able to enhance the performance of a semiconductor module in a simple manner by the addition of parallel half bridges. Moreover the modular semiconductor module offers the option of being able to realize a number of phases of a converter with one semiconductor module. The busbar arrangement succeeds in minimizing the coupling, in particular the magnetic coupling, between the direct current connections, in such a way that the individual half bridges can be operated independently of one another or at least almost independently of one another, even if the half bridges in the semiconductor module are arranged at a short distance from or in immediate proximity to one another.

BRIEF DESCRIPTION OF THE DRAWING

The invention will be described and explained in greater detail below with reference to exemplary embodiments shown in the figures. In the figures.

DETAILED DESCRIPTION OF PREFERRED EMBODIMENTS

Figure 5:
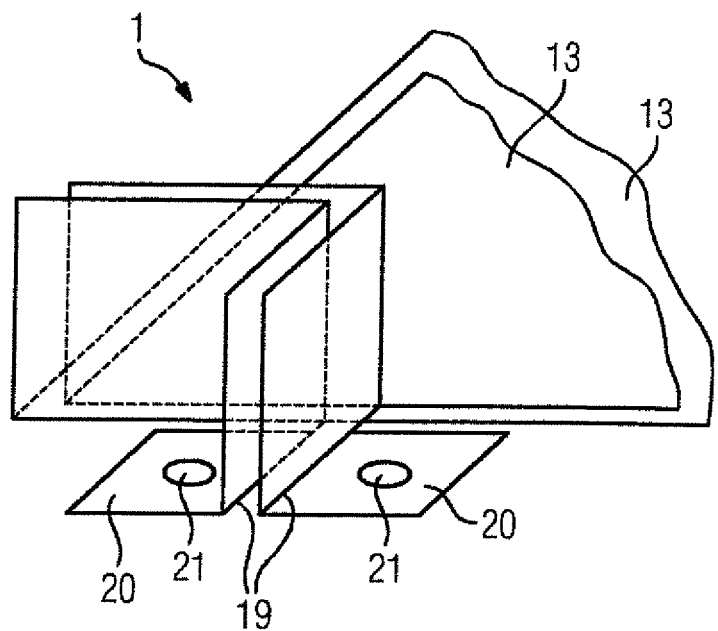
FIG. 5 shows another exemplary embodiment of a busbar arrangement, depicting connection elements lying at a same height.
Figure 6:
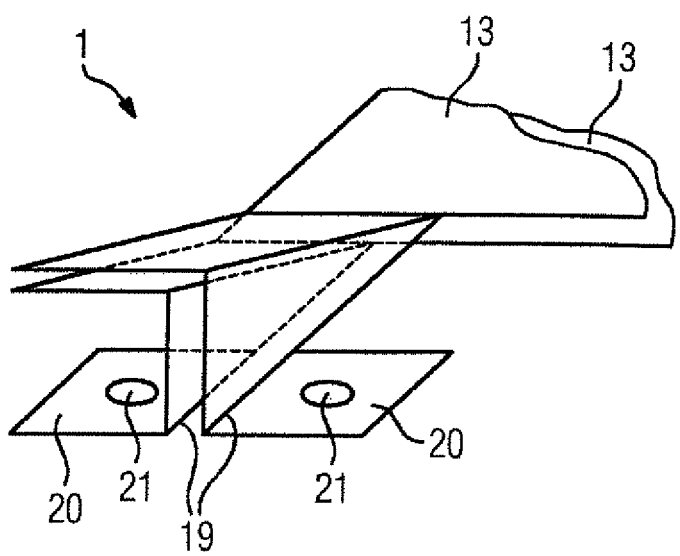
FIG. 6 shows still another exemplary embodiment of a busbar arrangement, depicting a busbar punched out of a flat conductor.
Figure 11:
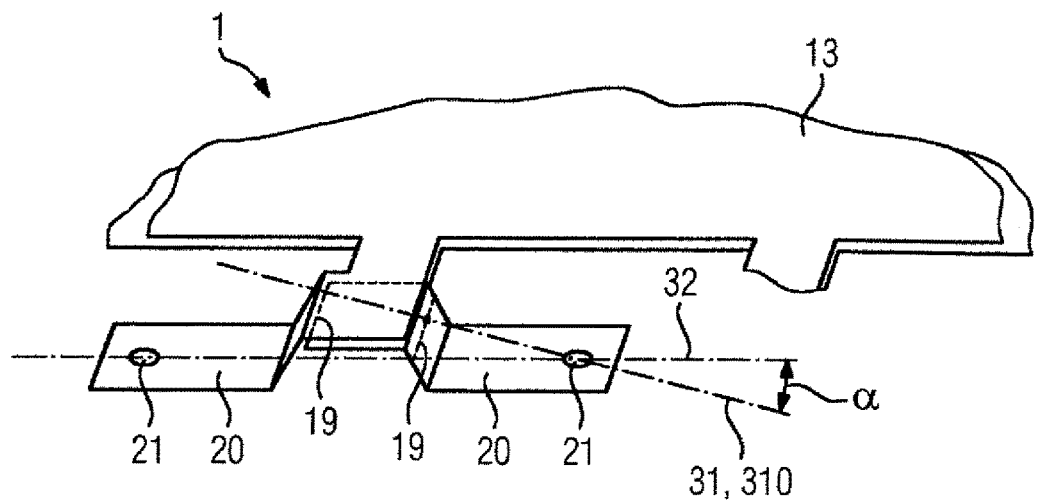
FIG. 11 shows still another exemplary embodiment of a busbar arrangement, depicting connection elements which do not lie in a plane with an overlap region.

The exemplary embodiments shown in FIGS. 5, 6 and 11 are not part of the subject matter of claim 1 but merely serve the understanding of the invention.

Figure 1:
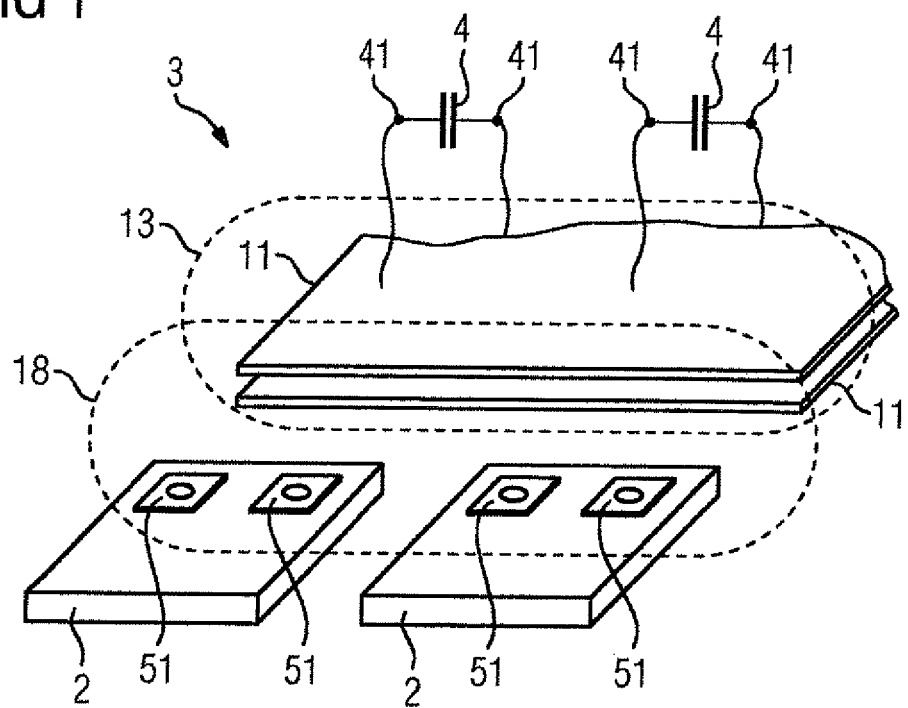
FIG. 1 shows components of a converter module.

FIG. 1 shows parts of a converter module 3. For reasons of clarity components are omitted here or only shown simplified. The task of a busbar arrangement 1 is to connect a semiconductor module 2 or a number of semiconductor modules 2 electrically to one or more capacitors 4. Only the overlap region 13 of the busbar arrangement 1 is shown in this diagram. The connection region 18, of which the position is indicated in this figure, has been omitted. In this exemplary embodiment the busbar arrangement 1 has two busbars, as is expedient for a two-point converter. However application examples with three or even more busbars are sensible for three-point converters or general multi-point converters for example. What the figure shows is that, in the overlap region 13, the busbars 11 are arranged overlapping, i.e. lying next to one another or above one another, depending on the viewpoint. The two busbars 11 are each connected electrically to an electrode 41 of a capacitor 4. Direct current connections 51 are available on the semiconductor modules 2 for the connection of the semiconductor module 2 to the busbars 11. The alternating current side connections of the semiconductor modules 2 as well as the precise depiction of the realization of a capacitor 4 have been omitted from the diagram for reasons of clarity.

Figure 2:
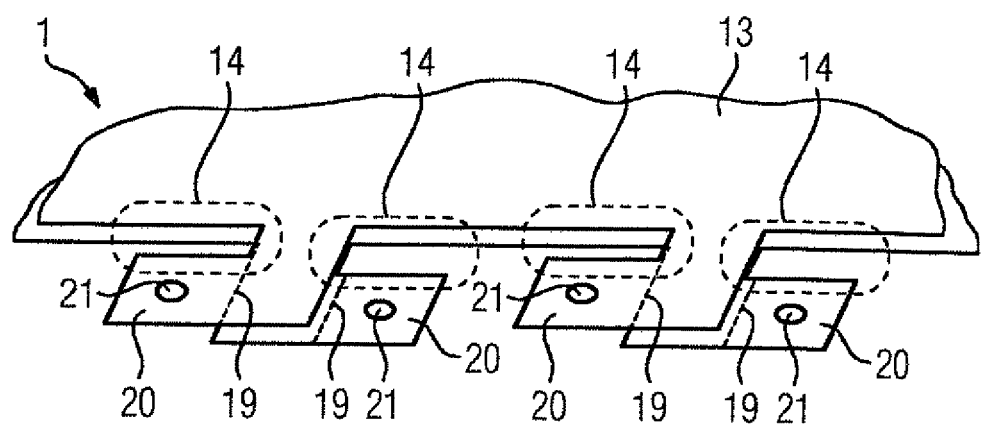
FIG. 2 shows parts of a busbar arrangement.

FIG. 2 shows a form of embodiment of the connection region 18 not shown in FIG. 1. This figure involves parts of the busbar arrangement 1 in the vicinity of the connection region 18. Here too the busbar arrangement 1 has two overlapping busbars 11. The busbars 11 have an overlap region 13 and webs 20. The transition 19 between web 20 and overlap region 13 is indicated in this figure by a dashed line. The webs 20, by contrast with the overlap region 13, are designed to be free from overlaps. The webs 20 have a connection element 21, with which electrical contact can be established to a direct current connection 51 of a semiconductor module 2 not shown here. The connection elements 21, as in the exemplary embodiment shown, can be realized in a simple manner by a hole. For connection to a semiconductor module 2 a screw is pushed through the hole as connection element 21 and screwed to a direct current connection 51 of the semiconductor module 2. In this case the webs 20 are oriented so that only a current that has a direction that essentially corresponds to the direction of a connection of two connection elements 21, can flow within them. A current perpendicular to the direction that is produced by the connection of two connection elements 21 is prevented by the insulating region 14. In a simple case the insulating region 14 involves an area in which no conductive material of the busbar 11 is present. The insulating region 14 is formed in this exemplary embodiment by a physical separation. This recess has the effect that a flow of current perpendicular to the direction of the second axis (formed by connection elements 21 of the webs) will be reduced or prevented in the web. No magnetic fields, which act on the respective other connection element 21, will be produced by the flow of current that occurs essentially in the direction of an axis, which is produced by the connection of the connection elements. Thus a coupling of the connections will reliably be prevented or at least greatly reduced. Only viewed from the connection element 21 on the other side of the transition 19 between web 20 and overlap region 13 does the current run in the busbar 11 perpendicular to the axis that is produced by the connection of the connection elements. Since however the two busbars 11 mutually overlap in this area, the magnetic fields of these two currents compensate for one another. These two currents are referred to as forward current and return current, since they are equal in amount and only differ in their leading sign.

Figure 3:
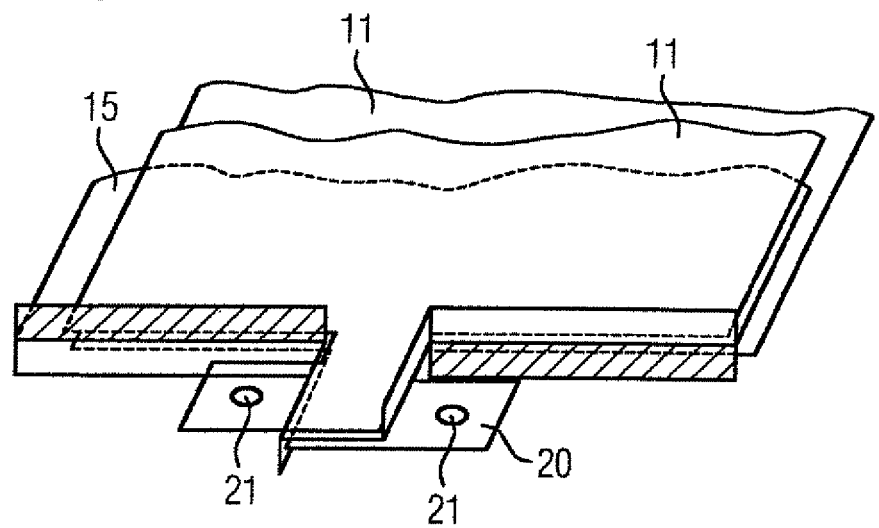
FIG. 3 shows an exemplary embodiment of a busbar arrangement with an insulating layer.

FIG. 3 shows an insulating layer 15, which is arranged between the busbars 11. This insulating layer 15, through its insulating effect, allows the busbars 11 to be arranged close to one another, even with a high potential difference, without causing discharge processes, such as flashovers when this is done. Moreover the insulating layer 15 guarantees a consistent spacing between the busbars 11. The insulating layer 15 also imparts a high rigidity to the structure of the busbar arrangement, especially when the busbars are fastened to the insulating layer 15.

Figure 4:
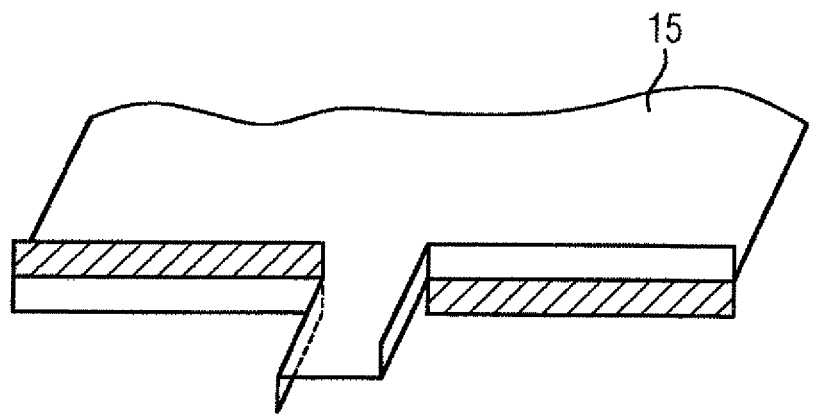
FIG. 4 shows an insulating layer.

FIG. 4 shows the insulating layer 15 without adjacent busbars 11. In this case the shaded surfaces of the insulating layer 15 can be dispensed with without negatively influencing the insulating property. The insulation between the different potentials can be embodied as a molded plastic part (injection molded part or press molded part), so that the insulating regions can be minimally molded out in the shape of recesses in the busbars. In this way a low-resistance and low-induction busbar arrangement 1 is produced.

FIG. 5 shows a further exemplary embodiment of a busbar arrangement 1. To avoid repetitions the reader is referred to the description for FIG. 2 and the reference numbers given for said figure. In a similar manner to FIG. 2 a current only flows in the webs 20 in the direction of an axis that is formed by the connection of the connection elements 21. It is precisely this direction of the current that prevents the formation of a magnetic field that extends to the other connection in each case. This enables a decoupling of the connections to be realized in a simple manner. Only viewed from the connection element 21 on the other side of the transition 19 between web 20 and overlap region 13 does the current run in the busbar 11 perpendicular to the axis that is produced by the connection of the connection elements. Since however in this area the two busbars 11 mutually overlap one another, the magnetic fields of these two currents compensate for one another.

Even if, in this exemplary embodiment for each busbar 11, which comprises an overlap region 13 and the web 20, only one web 20 is shown in each case, the busbar arrangement 1 can additionally comprise further webs 20 with connection elements 21, in order to be able to make contact between a number of semiconductor modules 2 and/or to be able to make contact between a number of direct current connections 51 of a semiconductor module 2. One of the advantages of this exemplary embodiment consists of the connection elements 21 lying at the same height. Since usually the direct current connections 51 of a semiconductor module 2 also lie at the same height, the connection can be made for example by means of a screw in the same way for both connection elements 21.

FIG. 6 shows a further exemplary embodiment of a busbar arrangement 1. To avoid repetitions the reader is referred to the description for FIGS. 2 and 5 and the reference numbers given for said figures. This figure too has the advantage that the connection elements 21 lie at the same height. By contrast with the exemplary embodiment shown in FIG. 5 this arrangement can be realized especially easily, since the busbars can be punched out of a flat conductor and made into the corresponding shape shown.

Figure 7:
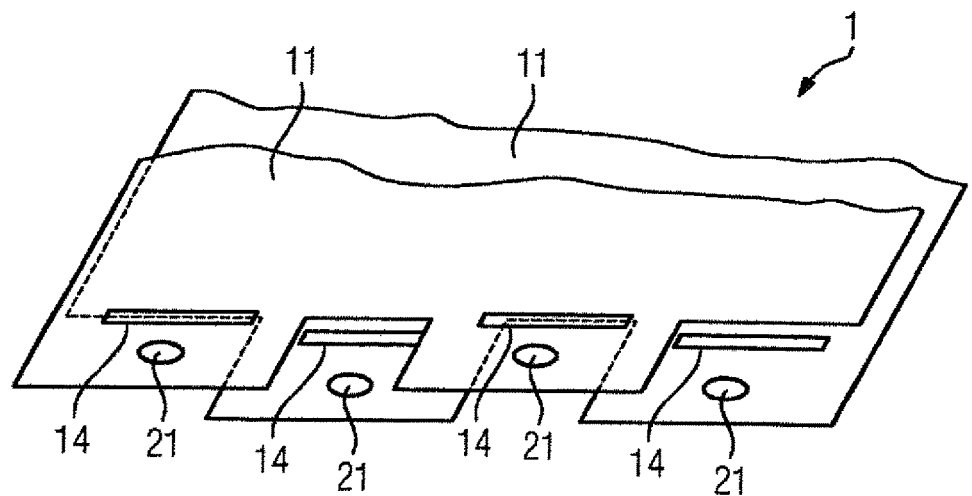
FIG. 7 shows still another exemplary embodiment of a busbar arrangement, depicting a web connected at two transitions to an overlap region.
Figure 8:
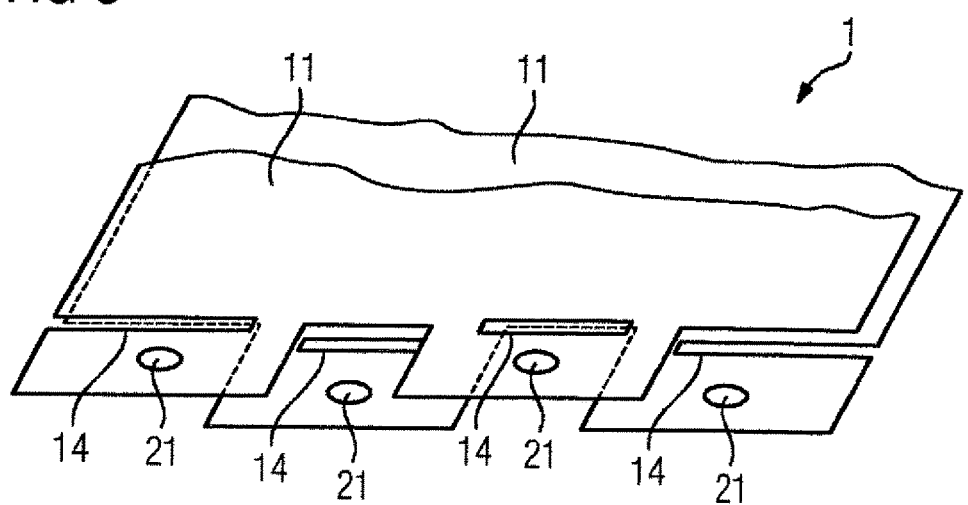
FIG. 8 shows still another exemplary embodiment of a busbar arrangement, depicting a web connected at one transition to an overlap region.

FIGS. 7 and 8 show exemplary embodiments in which the webs 20 are connected at two transitions to the overlap region 13. This imparts a high stability to the structure. To avoid repetitions the reader is referred to the description for FIGS. 2, 5 and 6 and also to the reference numbers given for said figures. The high stability at the connection elements 21 enables the busbar arrangement 1 to be mechanically fastened by means of the connection elements 21. The mechanical fastening of the busbar arrangement 1 can be dispensed with or at least dimensioned correspondingly small. In the exemplary embodiment of FIG. 7 all webs each have two transitions to the overlap region. This means that the ohmic conditions for the individual connection elements 21 are the same or at least almost the same. By contrast the webs 20 of the exemplary embodiment of FIG. 8 each only have one transition between web 20 and overlap region 13. This means that the ohmic conditions are different, however the inductive behavior is the same or at least almost practically the same in the individual connection elements 21 of the different webs 20.

Figure 9:
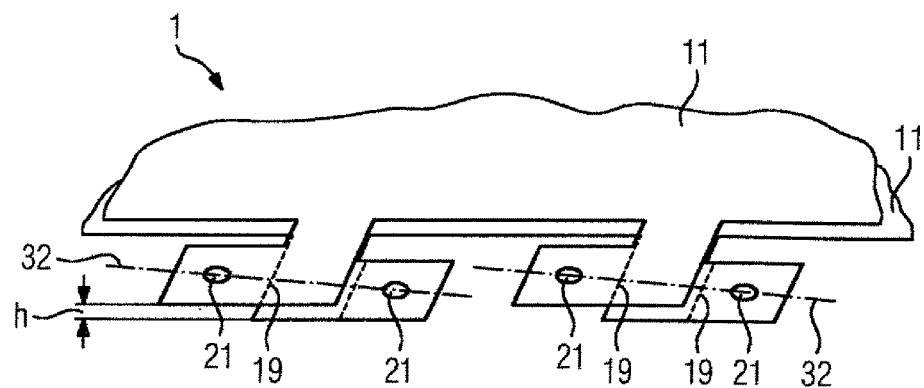
FIG. 9 shows the location of a second axis.
Figure 10:
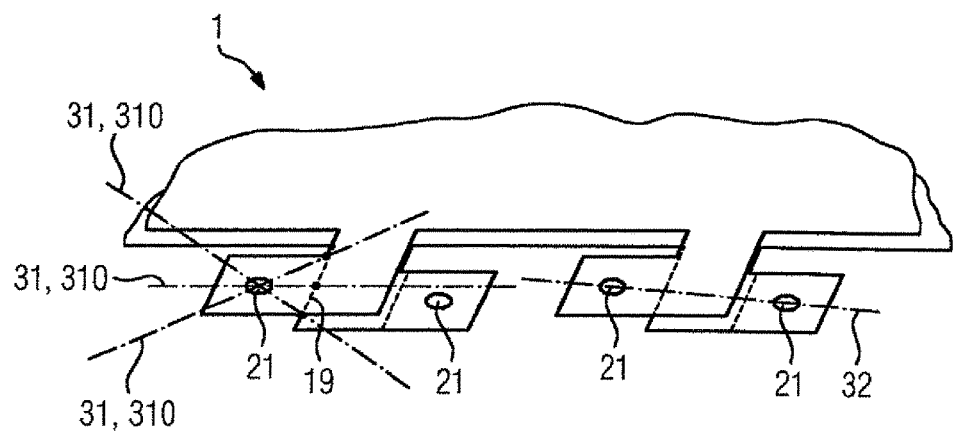
FIG. 10 shows the location of a first axis and of a further first axis.

FIG. 9 and FIG. 10 are intended to illustrate how the described first and second axes are formed. To this end in FIG. 9 a second axis 32 is drawn in twice, which runs between the connection elements 21. For an assessment regarding a parallel course, it is assumed in the description with the word "essentially" that the height difference h between the two connection elements 21 is negligible. Investigations have shown that the negligible angle caused by the height difference h, depending on the embodiment of the webs 20, lies in the range of 0° to 10° or 0° to 20°. Thus the course of a first axis 31, 310 and of a second axis 32 can even then be seen as essentially parallel when a variation of the second axis 32 in the ranges given above leads to the two axes being arranged in parallel after the variation has been made.

FIG. 10 shows how a first axis 31 or a further first axis 310 can be formed. To do this the connection element 21 and a point of the transition 19 between web 20 and overlap region 13 are connected to one another. In this case it becomes clear that, depending on the choice of the point on the transition 19, the first axes 31 or the further first axes 310 can differ. For comparison a second axis 32 is drawn in once again on the right-hand side, which runs through the connection points 21 of the webs 20 on the right-hand side.

FIG. 11 shows a further exemplary embodiment of a busbar arrangement 1. To avoid repetitions the reader is referred to the description for the preceding figures and also to the reference numbers given for said figures. In this exemplary embodiment the connection elements do not lie in a plane with the overlap region 13. The web 20 has a section, which brings the section around the connection element 21 outside the plane of the overlap region 13. If a first axis 31 or a further first axis 310 is now formed for this exemplary embodiment, which is formed by the connection element 21 and a point of the transition 19 between web 20 and overlap region 13, then this first or further first axis 31, 310 intersects with the second axis 32 at an angle α. Two different connection elements 21 can then in particular be especially well decoupled if the angle α lies in a range of 0° to 45°. It has proved to be especially advantageous for the angle α to have a value of 0°. In this case first or further first axis 31, 310 lie parallel to the second axis.

With this exemplary embodiment it is possible in a simple way to compensate for a difference in the spacing of the first and second busbar 11, as occurs in the overlap region, from the connection elements. Thus the busbars 11 lie parallel to the second axis 32.

The second pair of webs 20 has not been shown in FIG. 11 (cut edge), in order to enhance the clarity of the drawing. In this exemplary embodiment too the busbar arrangement 1 can be expanded in a simple manner by addition of further webs 20 with further connection elements 21 for making contact with further direct current connections 51 of one or more semiconductor modules 2.

Figure 12:
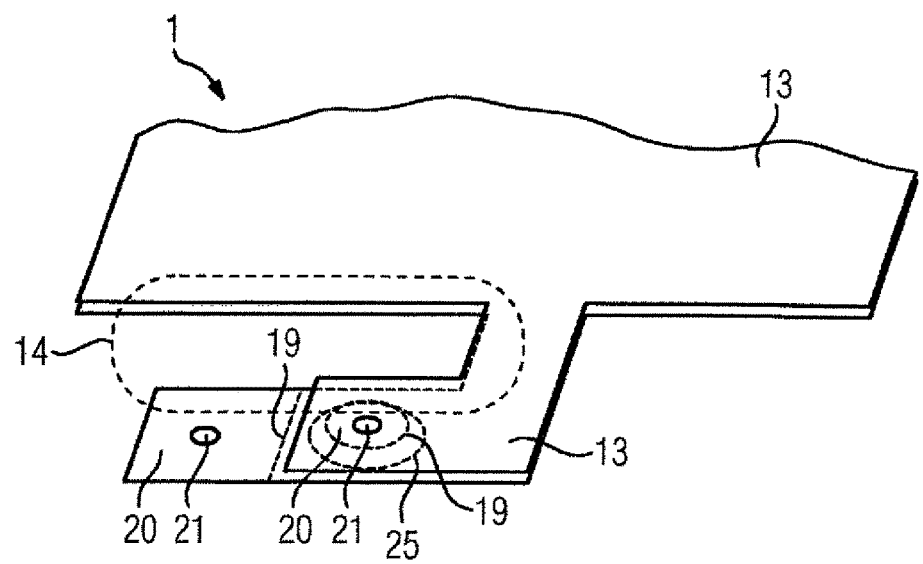
FIG. 12 shows still another exemplary embodiment of a busbar arrangement, depicting two connection elements with one connection element having a mounting hole.

FIG. 12 shows a further exemplary embodiment of a busbar arrangement 1. To avoid repetitions the reader is referred to the description for the preceding figures and also to the reference numbers given for said figures. This exemplary embodiment too has two connection elements 21. On the left-hand side in the lower busbar 11 and on the right-hand side in the upper busbar 11. So that the right-hand connection element 21 can make contact with a semiconductor module not shown in the figure, a mounting hole 25 is located in the lower busbar, through which for example a screw from the upper, busbar can be connected through the mounting hole 25 to the semiconductor module 2 without making electrical contact with the lower bar. In the area of the mounting hole 25 the upper busbar 11 represents a web 20. The insulating region 14, realized as a recess here, prevents or reduces a flow of current in the webs 20 perpendicular to a connection line, which is formed by the connection elements 21. In this exemplary embodiment too the busbar arrangement 1 can be expanded in a simple manner by addition of further webs 20 with further connection elements 21 for making contact with further direct current connections 51 of one or more semiconductor modules 2.

Figure 13:
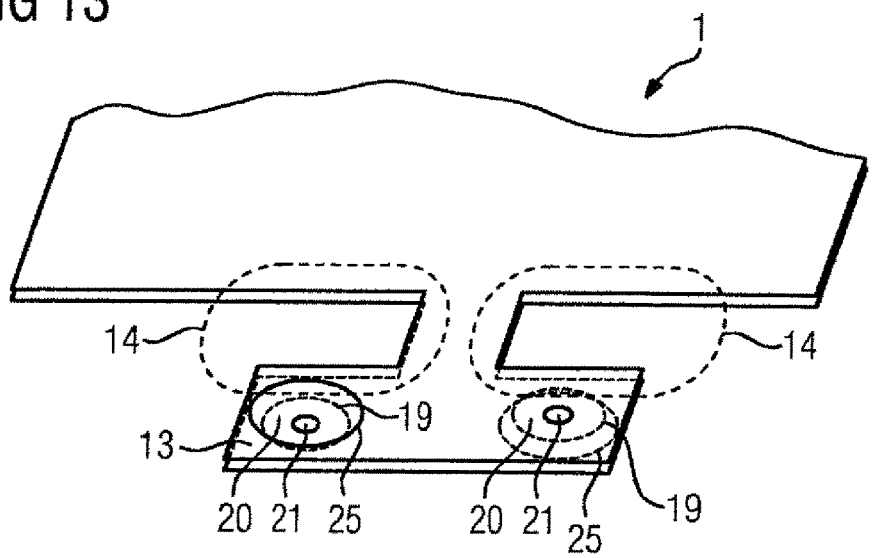
FIG. 13 shows still another exemplary embodiment of a busbar arrangement, depicting two connection elements with corresponding mounting hole.

FIG. 13 shows a further exemplary embodiment of a busbar arrangement 1. To avoid repetitions the reader is referred to the description for the preceding figures and also to the reference numbers given for said figures. By contrast with the exemplary embodiment of FIG. 12, this exemplary embodiment has two mounting holes 25, which serve, when contact is made with a semiconductor module, not to establish electrical contact between the busbars 11. The web is thus formed in both connection elements by the circular surface, which is located where the other busbar has the mounting hole in each case. The connection element 21 is located for the left-hand web 20 in the upper busbar and for the left-hand web 20 in the lower busbar. The insulating region 14, realized as a recess here, prevents or reduces a flow of current in the webs 20 perpendicular to a connecting line that is formed by the connection elements 21. In this exemplary embodiment too the busbar arrangement 1 can be expanded in a simple manner by addition of further webs 20 with further connection elements 21 for making contact with further direct current connections 51 of one or more semiconductor modules 2.

Figure 14:
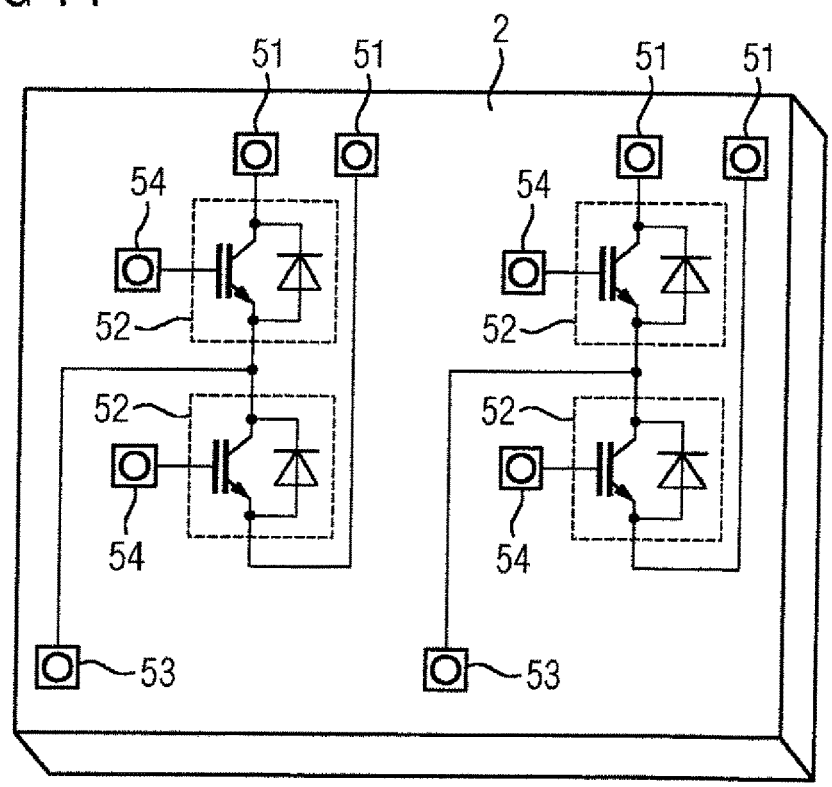
FIG. 14 shows a semiconductor module of modular construction.

FIG. 14 shows a schematic of the structure of a modular semiconductor module 2. Two bridge modules are arranged in this exemplary embodiment. Each of these bridge modules has a series circuit of two semiconductor switches 52. The connection point of the two semiconductor switches 52 is connected to the phase connection 53, which is arranged on the outside of the semiconductor module 2. The phase connections 53 can be connected to one another, in order to increase the performance of a phase or to form different phases of a converter. For this purpose the ends of the series circuit are also routed as direct current connections 51 to the outside of the semiconductor module. Thus each bridge circuit has at least two direct current connections 51. These are at least one DC+ connection and at least one DC− connection. In order to lower the resistance when contact is made with the semiconductor module, more than two direct current connections can be provided for a semiconductor module. If the direct current connections 51 make contact with a busbar arrangement 1 proposed here, then it can be insured that the direct current connections 51 are decoupled from one another or at least only have a slight coupling such that the individual half bridges, despite their physical proximity in the arrangement in a modular semiconductor module 2, can be operated Independently of one another.

The control connections 54 serve to control the semiconductor switches 52.

The half bridges can also have more than two semiconductor switches 52 arranged in series, in order for example to be able to establish the phase of a multi-point inverter, especially of a 3-point inverter, in a simple manner.

Although the invention has been illustrated and described in greater detail by the preferred exemplary embodiments, the invention is not restricted solely to the disclosed example and other variations can be derived herefrom by the person skilled in the art, without departing from the scope of protection of the invention.

In summary the invention relates to a busbar arrangement for making electrical contact with at least one semiconductor module, wherein the busbar arrangement has at least two busbars, wherein the busbars are arranged in a mutually overlapping manner at least in an overlap region of the busbar arrangement, wherein the busbars are electrically insulated from one another, wherein the busbars each have at least one web with a connection element, wherein the webs of the busbars are arranged without an overlap. To reduce the interaction between the connections of the semiconductor module or of the semiconductor modules, it is proposed to orient the webs such that a first axis can be formed, which runs through the connection element of the respective web and a point of a transition of the respective web to the overlap region of the busbar arrangement, and which intersects with a second axis, which is formed by a connection of two connection elements of the webs, at an angle of between 0° and 45°, wherein the busbars each have an insulating region, which is arranged so as to reduce or to prevent a current in the web in a direction perpendicular to the second axis. The invention further relates to a converter module with a busbar arrangement of this kind.

What is claimed is:

1. A busbar arrangement for making electrical contact with a semiconductor module, said busbar arrangement comprising:
    at least two busbars overlapping one another in an overlap region and electrically insulated from one another, each of the busbars including a web having a connection element, with a web of one of the busbars and a web of another one of the busbars arranged in an absence of an overlap, said webs oriented such as to define a first axis which runs through the connection element of an associated one of the webs and a point of a transition of the associated one of the webs to the overlap region of the busbar arrangement, and which intersects a second axis which is formed by a connection between two connection elements of the webs at an angle between 0° and 45°; and
    an insulating region configured to reduce or prevent a current in the web in a direction perpendicular to the second axis,
    wherein the overlap region and the webs are each located in one plane.

2. A converter module, comprising:
    a busbar arrangement for making electrical contact with a semiconductor module, said busbar arrangement comprising at least two busbars overlapping one another in an overlap region and electrically insulated from one another, each of the busbars including a web having a connection element, with a web of one of the busbars and a web of another one of the busbars arranged in an absence of an overlap, said webs oriented such as to define a first axis which runs through the connection element of an associated one of the webs and a point of a transition of the associated one of the webs to the overlap region of the busbar arrangement, and which intersects a second axis which is formed by a connection between two connection elements of the webs at an angle between 00 and 45°, and an insulating region configured to reduce or prevent a current in the web in a direction perpendicular to the second axis, wherein the overlap region and the webs are each located in one plane;

the semiconductor module having two direct current connections connected electrically to the connection elements of the busbar arrangement, respectively; and a capacitor having two electrodes, wherein the busbars of the busbar arrangement are connected electrically to the electrodes of the capacitor.

3. The busbar arrangement of claim 1, wherein the busbars have each at least two webs, each of the webs having at least one connection element.

4. The busbar arrangement of claim 1 for connection of the semiconductor module to a capacitor, in particular in a converter.

5. The converter module of claim 2, further comprising a further semiconductor module, wherein the direct current connections of the semiconductor modules are arranged in a parallel circuit.

6. The converter module of claim 2, wherein the semiconductor module includes at least two series circuits of semiconductor switches and at least four direct current connections.

7. The converter module of claim 2, wherein the insulating region is configured to reduce or prevent formation of the current in the direction perpendicular to the second axis in the transition between the web and the overlap region.

8. The converter module of claim 2, wherein the insulating region is configured to adjoin the overlap region.

9. The converter module of claim 2, wherein the insulating region is arranged in at least one section at a boundary between the web and the overlap region.

10. The converter module of claim 2, wherein at least two of the webs are embodied symmetrically to one another.

11. The converter module of claim 2, further comprising an insulating layer arranged in the overlap region between the busbars, said busbars each having at least one section in adjoining relationship to the insulating layer.

12. The converter module of claim 2, wherein the busbars have each at least two webs, each of the webs having at least one connection element.

13. The busbar arrangement of claim 1, wherein the insulating region is configured to reduce or prevent formation of the current in the direction perpendicular to the second axis in the transition between the web and the overlap region.

14. The busbar arrangement of claim 1, wherein the insulating region is configured to adjoin the overlap region.

15. The busbar arrangement of claim 1, wherein the insulating region is arranged in at least one section at a boundary between the web and the overlap region.

16. The busbar arrangement of claim 1, wherein at least two of the webs are embodied symmetrically to one another.

17. The busbar arrangement of claim 1, further comprising an insulating layer arranged in the overlap region between the busbars, said busbars having each at least one section in adjoining relationship to the insulating layer.

* * * * *